United States Patent [19]

Hsu

[11] Patent Number: 4,945,070
[45] Date of Patent: Jul. 31, 1990

[54] METHOD OF MAKING CMOS WITH SHALLOW SOURCE AND DRAIN JUNCTIONS

[75] Inventor: Sheng T. Hsu, Lawrenceville, N.J.

[73] Assignee: Harris Corporation, Melbourne, Fla.

[21] Appl. No.: 301,073

[22] Filed: Jan. 24, 1989

[51] Int. Cl.$^5$ .......................................... H01L 21/235
[52] U.S. Cl. ...................... 437/160; 437/41; 437/34; 437/57; 437/162; 437/192; 437/200; 437/46; 437/950; 357/44; 357/59; 148/DIG. 35; 148/DIG. 123
[58] Field of Search ............... 437/34, 40, 41, 43, 437/46, 57, 59, 162, 160, 192, 200, 233, 950; 357/41, 42, 44, 59 G, 59 I; 148/DIG. 147, DIG. 123, DIG. 35

[56] References Cited

U.S. PATENT DOCUMENTS

| | | | |
|---|---|---|---|
| 4,359,816 | 11/1982 | Abbas et al. | 437/44 |
| 4,378,627 | 4/1983 | Jambotkar | 437/44 |
| 4,419,810 | 12/1983 | Riseman | 437/162 |
| 4,450,620 | 5/1984 | Fuls et al. | 437/40 |
| 4,453,306 | 6/1984 | Lynch et al. | 437/201 |
| 4,558,507 | 12/1985 | Okabayashi et al. | 437/200 |
| 4,735,916 | 4/1988 | Homma et al. | 437/57 |
| 4,737,472 | 4/1988 | Schaber et al. | 437/59 |
| 4,764,481 | 8/1988 | Alvi et al. | 437/162 |
| 4,782,033 | 11/1988 | Gierisch et al. | 437/200 |
| 4,784,971 | 11/1988 | Chiu et al. | 437/43 |
| 4,786,611 | 11/1988 | Pfiester | 437/162 |
| 4,826,782 | 5/1989 | Sachitano et al. | 437/41 |

FOREIGN PATENT DOCUMENTS

| | | |
|---|---|---|
| 0105366 | 6/1984 | Japan . |
| 0105367 | 6/1984 | Japan . |
| 0007190 | 12/1986 | World Int. Prop. O. . |

OTHER PUBLICATIONS

Ghandhi, *VLSI Fabrication Principles*, John Wiley & Sons, 1983, pp. 435–437.
Huang et al., "A MOS Transistor with Self-Aligned Polysilicon Source –Drain", IEEE Electron Device Letters, vol. EDL-7, No. 5, May 1986, pp. 314–316.
Oh et al., "A New Mosfet Structure with Self-Aligned Polysilicon Source and Drain Electrodes", IEEE Electron Device Letters, vol. EDL-5, No. 10, Oct. 1984, pp. 400–402.

*Primary Examiner*—Brian E. Hearn
*Assistant Examiner*—Mary Anne Wilczewski
*Attorney, Agent, or Firm*—K. R. Glick

[57] ABSTRACT

A CMOS device having shallow source and drain regions is formed in a body of single crystalline silicon having a major surface by forming in the body adjacent well regions of opposite conductivity type having an isolation region of an insulating material extending into the body from the major surface along the junction of the well regions. Thin layers of silicon oxide are formed on the major surface over each of the well regions, and a gate line of conductive polycrystalline silicon is formed over each of the silicon oxide layers. The side walls of the gate lines are covered with a layer of silicon oxide. A layer of polycrystalline silicon is selectively deposited on the surface of the body at each side of each gate line and on the gate lines. A layer of a refractory metal is deposited on the polycrystalline silicon layer. The polycrystalline silicon layer is heated to cause the metal to react with the silicon and form a metal silicide region at least partially through the polycrystalline silicon layer. The silicide region over each of the well regions is doped with a conductivity modifier of a conductivity type opposite that of the well region. The device is then heated to diffuse the conductivity modifiers through the polycrystalline silicon layer into the silicon body to form shallow source and drain regions in each well at each side of the gate lines.

15 Claims, 2 Drawing Sheets

METHOD OF MAKING CMOS WITH SHALLOW SOURCE AND DRAIN JUNCTIONS

FIELD OF THE INVENTION

The present invention relates to a method of making a MOS transistor with shallow source and drain junctions, and, more particularly, to a method of making complementary MOS (CMOS) integrated circuits with the MOS transistors having shallow source and drain junctions.

BACKGROUND OF THE INVENTION

With the MOS transistors of CMOS integrated circuits being made smaller, it has been found necessary to make the source and drain junctions of such transistors very shallow. It has been found that standard methods of doping the source and drain regions, such as by diffusion or ion implantation, cannot produce junctions which are both sufficiently shallow and have the necessary concentration of conductivity modifiers. It has been shown that semiconductor junctions as shallow as 50 nanometers can be made using a doped refractory metal silicide as a diffusion source. However, the application of this technique to submicron channel length CMOS integrated circuits raises a number of problems.

One technique which has been used to selectively form a refractory metal silicide on a bare silicon surface but not on insulating material adjacent the bare silicon surface is to deposit the refractory metal over both the exposed silicon surface and the surface of the insulating material adjacent the exposed surface. The device is then heated to a temperature at which the metal on the exposed silicon surface reacts with the silicon to form the silicide. However, there is not enough silicon in the oxide layer to combine with the metal thereon to form a silicide. Thus, the silicide is selectively formed only on the bare silicon surface. The metal remaining on the oxide layer can then be removed with a selective etch. The silicide can then be doped so as to be a diffusion source for forming a junction in the silicon body. A problem with this technique is that when forming the silicide, silicon ions diffuse very rapidly into the metal so that the edge of the silicide is not well defined. If the space between the bare silicon areas, such as the channel region of a MOS transistor, is very small, silicide stringers can be formed during the silicidization step which could bridge the space between the adjacent silicide areas. Small silicide strips could be as large as 1 micrometer or larger. Thus, for submicron MOS transistors wherein the distance across the channel region is less than 1 micrometer, the process is not reliable.

Another technique which has been used to selectively form a refractory metal silicide on a bare silicon surface is to use a refractory metal which can be selectively deposited on bare silicon and will not deposit on an oxide layer. Tungsten, molybdenum and tantalum can be so selectively deposited using a low pressure chemical vapor deposition process. The refractory metal can thus be deposited only on the bare silicon surface where it can be silicided upon heating. A problem with this method is that the selective deposition process consumes silicon. For example, a 1 nanometer layer of tungsten deposited onto bare silicon will consume 2 nanometers of silicon. As a result the surface of the silicon is lowered by the thickness of the tungsten deposited. At the edge of the bare silicon surface, the tungsten actually tunnels under the adjacent oxide layer. After silicidization, implantation and diffusion for shallow junctions, the junction depth at the edge regions is extremely shallow. The radius of curvature at the edge of the junction is very small. In addition, there is stress at the silicide/silicon interface. Also, since the breakdown voltage of this shallow junction is very small, the drain breakdown voltage for junctions made with this method will be small.

One attempt to overcome the above problems was to selectively deposit a thin layer of single crystalline silicon onto the source and drain regions prior to depositing the refractory metal and siliciding it. This eliminates the shallow junction formation and breakdown problems. However, the control of very shallow effective drain junctions is not easy, and, if a drain extension is desire, the process becomes even more difficult to control.

SUMMARY OF THE INVENTION

A method of forming in a body of single crystalline semiconductor material of one conductivity type having a major surface a shallow region of the opposite conductivity type. The method includes the steps of forming a layer of polycrystalline silicon directly on the surface of the body with the polycrystalline silicon layer having a region of a refractory metal silicide at least partially therethrough. The silicide layer is then doped with a conductivity modifier of the conductivity type opposite to that of the body, and the device is heated to diffuse the conductivity modifier from the silicide layer into the body to form the shallow region.

DETAILED DESCRIPTION OF PREFERRED EMBODIMENT

The method of the present invention will be described with regard to a trench isolated twin-tub CMOS process with the device being fabricated in a P− type conductivity epitaxial layer on a P+ type conductivity silicon substrate. However, it should be understood that the present invention can also be used with any type of CMOS process, such as an N-well or P-well process, using other type of insulation between transistors. Also, the starting material can be N type or P type bulk material, or N− type or P− type epitaxial layer on either N+ or P+ type substrates.

Figure 1:
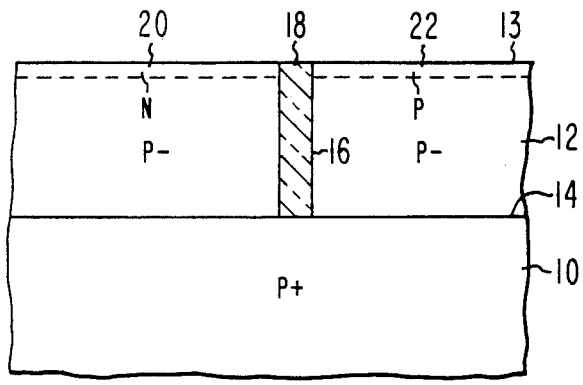
FIGS. 1 through 6 are sectional views illustrating the various steps of forming a CMOS integrated circuit using the method of the present invention.

Referring initially to FIG. 1, a method of making a CMOS integrated circuit utilizing the present invention for forming shallow source and drain junctions starts with a substrate 10 of P+ conductivity type single crystalline silicon having a layer 12 of P− type single crystalline silicon epitaxially deposited on a surface 14 thereof. An isolation trench 16 is formed through the epitaxial layer 12 by applying a layer of a photoresist material over the surface 13 of the expitaxial layer 12, and, using standard photolithographic techniques, forming an opening in the photoresist layer over the area of the epitaxial layer 12 where the trench 16 is to be formed. The exposed area of the epitaxial layer 12 is etched to form the trench 16. The trench 16 is then filled with an insulating material 18, such as silicon oxide, using standard chemical vapor deposition techniques.

Figure 2:
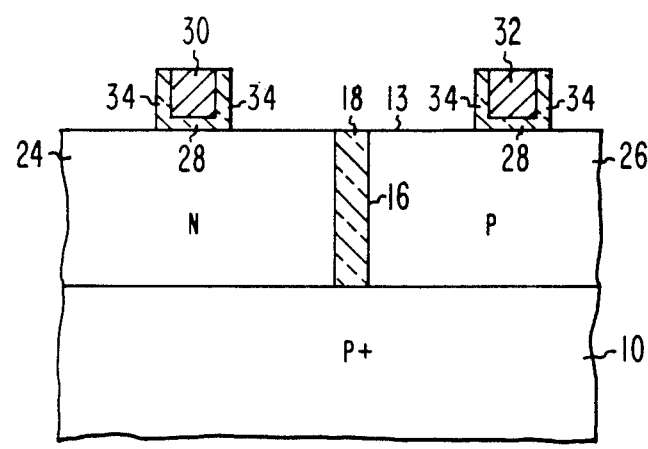

A layer of a photoresist is applied over area of the surface 13 of the expitaxial layer 12 at one side of the trench 16, and ions of a N type conductivity modifier, such as phosphorus, are implanted in the exposed area of the epitaxial layer 12 at the other side of the trench 16 to form a thin N type conductivity region 20 in the expitaxial layer 12. The photoresist layer is removed, and another photoresist layer is provided over the N type region 20. Ions of a P type conductivity modifier, such as boron, are then implanted in the exposed area of the epitaxial layer 12 to form a thin P type region 22 in the epitaxial layer 12. The device is then heated to drive the implanted ions into the epitaxial layer 12, and, as shown in FIG. 2, form an N well 24 and a P well 28 in the epitaxial layer 12 on opposite sides of the trench 16.

A thin layer 28 of silicon oxide is grown on the surface 13 of the epitaxial layer 12 by heating the device while exposing it to an atmosphere containing oxygen. The silicon oxide layer 28 will serve as the gate oxide of the MOS transistors. A relatively thick layer, between 500 and 700 nanometers, of polycrystalline silicon is deposited over the oxide layer 28 using a standard chemical vapor deposition technique. A layer of a photoresist is applied over the polycrystalline silicon layer and, using standard photolithographic techniques, is defined to be only over the areas of the polycrystalline silicon layer which are to form the gate lines of the MOS transistors. The exposed areas of the polycrystalline silicon layer are then removed, such as by a plasma etch, to form the gate lines 30 and 32 over the silicon oxide layer 28, as shown in FIG. 2. Before, applying the photoresist layer over the polycrystalline silicon layer, the polycrystalline silicon layer is preferably doped with either a P type or N type conductivity modifier to make it more conductive.

The device is then heated in an atmosphere containing oxygen so as to form a thin layer 34 of silicon oxide over the entire surface of each of the gate lines 30 and 32. The silicon oxide layer 34 should be thicker than the gate silicon oxide layer 28 but thinner than about 100 nanometers. The device is then subjected to an anisotropic plasma etch for silicon oxide. This removes the portion of the silicon oxide layer 34 which is on the top surface of the gate lines 30 and 32, but does not remove the portions of the silicon oxide layer 34 on the sides of the gate lines 30 and 32 as shown in FIG. 2. This also removes the portions of the silicon oxide layer 28 on each side of the gate lines 30 and 32 so as to expose the surface 13 of the expitaxial silicon layer 12 on each side of the gate lines 30 and 32.

Figure 3:
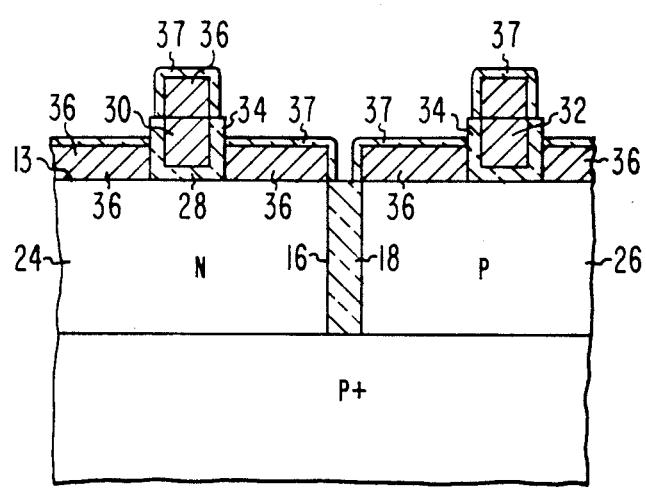
Figure 4:
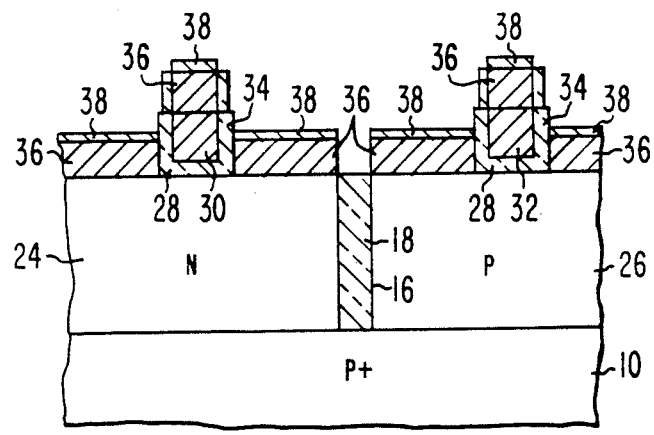

As shown in FIG. 3, a layer 36 of polycrystalline silicon is selectively deposited on the exposed areas of the surface 13 of the expitaxial silicon layer 12 on each side of the gate lines 30 and 32. This may be achieved by a low temperature epitaxial growth process. The polycrystalline silicon layer 36 also deposits on the gate lines 30 and 32 but not on any silicon oxide, such as the silicon oxide 18 in the trench 16. The thickness of the polycrystalline silicon layer 36 should be at least 100 nanometers less than the thickness of the gate lines 30 and 32. The device is then heated in an atmosphere containing oxygen so as to form a thin layer 37 of silicon oxide over the entire surface of the newly grown polycrystalline silicon layer 36 on the gate lines 30 and 32 and the surface 13 on each side of the gate lines 30 and 32. The device is then subjected to an anisotropic plasma etch for silicon oxide. This removes the portion of the silicon oxide layer 37 which is on the top surface of the gate lines 30 and 32, but does not remove the portions of the silicon oxide layer 37 on the sides of the gate lines 30 and 32 as shown in FIG. 4. This also removes the portion of the silicon oxide layer 37 which is on the polycrystalline silicon layer 36 at each side of the gate lines 30 and 32.

Figure 5:
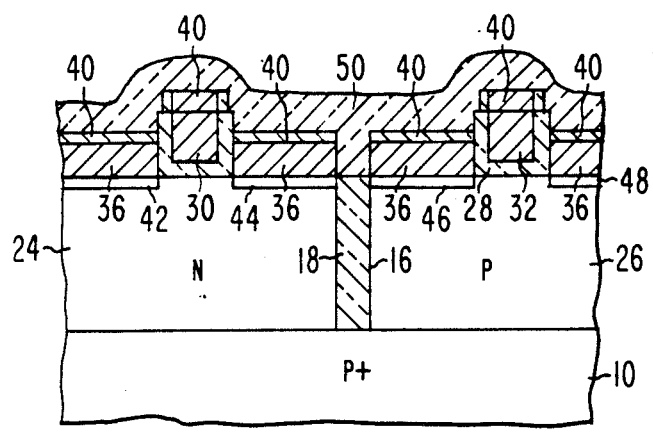

As shown in FIG. 4, a layer 38 of a refractory metal, such as tungsten, is then selectively deposited on the polycrystalline silicon layer 36. This can be achieved by low pressure chemical vapor deposition. The device is than heated to about 800° C. to cause the refractory metal to react with the polycrystalline silicon and form a layer 40 of a refractory metal silicide as shown in FIG. 5. It is not necessary that all of the polycrystalline silicon layer 36 be converted to the silicide.

The portion of the silicide layer 40 over one of the wells, such as the P well 26, is then covered with a resist layer and ions of a N type conductivity modifier, such as phosphorus, are implanted into the portion of the silicide layer 40 over the N well 24. The resist layer over the P well 26 is then removed and a resist layer is provided over the portion of the silicide layer 40 over the N well 24. The portion of the silicide layer 40 over the P well 26 is then implanted with ions of a P type conductivity modifier, such as boron. The doses of the ions implanted into the silicide layer 40 is controlled so that after all heat treatments, the doping concentration at the polycrystalline silicon layer 36 is in the order of between $1.0 \times 10^{17}$ and $5.0 \times 10^{18}$ atoms/cm$^{-3}$. The heat treatments that occur after the implantation, such as the implantation anneal, causes the conductivity modifiers from the silicide layer 40 to diffuse through the polycrystalline silicon layer 36 and into the epitaxial silicon layer 12 and thereby form shallow source and drains regions 42, 44, 46 and 48 on each side of each of the gate line 30 and 32 respectively.

Figure 6:
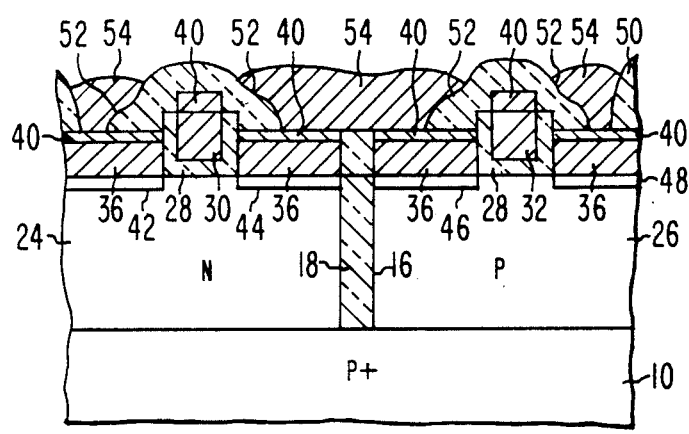

The CMOS integrated circuit can then be completed in any desired standard manner. For example, as shown in FIG. 5, a layer 50 of an insulating material, such as a phosphorus silicate glass or a boron, phosphorus silicate glass, is coated over the entire device and is heated to cause it to flow and have a smooth surface. As shown in FIG. 6, openings 52 are then formed through the insulating layer 50 to the portions of the silicide layer 40 over the source and drain regions 42, 44, 46 and 48. A metal is then deposited over the insulating layer 50 and in the openings 52 and is defined to form the contacts 54 for the source and drain regions. Similarly, metal contacts, not shown, are provided for the gate lines 30 and 32.

In the method of the present invention the silicided polycrystalline silicon layer acts as a diffusion source for forming the source and drain regions of the MOS transistors. As previously stated, diffusion from a silicide allows for the achievement of very shallow diffusions to form shallow source and drain regions. Since the silicide is formed in the polycrystalline silicon layer which is on the surface of the silicon body, the edges of the silicide regions are well defined, there are no silicide stringers formed over the gate lines, and the silicon of the body is not used to form the silicide. Also, conductivity modifiers diffuse faster through polycrystalline silicon than through single crystalline silicon. Thus, when the silicided polycrystalline silicon layer is doped with the conductivity modifiers, the ions of the conductivity modifiers will diffuse rapidly through the silicided polycrystalline silicon layer to the surface of the silicon body to provide the desired concentration of the ions at the interface of the polycrystalline silicon layer and the silicon body, but will not diffuse so fast into the single crystalline silicon body. This permits the achievement of the shallow diffused source and drain regions at the surface of the single crystalline silicon body having the desired high concentration of the ions of the conductivity modifiers.

I claim:

1. A method of making a MOS transistor having shallow source and drain regions in a body of single crystalline silicon of one conductivity type having a major surface comprising the steps of:
   forming a thin layer of silicon oxide on a portion of the major surface of the body;
   forming a gate line of a conductive material on the silicon oxide layer;
   then forming on the major surface of the silicon body on each side of the gate line a layer of polycrystalline silicon having a region of a refractory metal silicide extending at least through a portion thereof;
   then doping the silicide region with a conductivity modifier of a conductivity type opposite to that of the silicon body; and
   then heating the body to diffuse the conductivity modifier through the polycrystalline silicon layer into the silicon body to form the shallow source and drain regions of the transistor.

2. A method in accordance with claim 1 in which the pollycrystalline silicon layer having the region of a metal silicide is formed by forming a layer of polycrystalline silicon on the major surface of the body on each side of the gate line, depositing a layer of a refractory metal on the polycrystalline silicon layer, and heating the polycrystalline silicon layer to cause the metal to react with the silicon and form the refractory metal silicide.

3. A method in accordance with claim 2 in which the polycrystalline silicon layer is formed by depositing the layer by chemical vapor deposition.

4. A method in accordance with claim 3 in which the metal silicide is doped by diffusing the conductivity modifier in to the silicide region.

5. A method in accordance with claim 2 in which the polycrystalline silicon layer is also deposited on the gate line and the refractory metal is also deposited on the portion of the polycrystalline silicon layer which is on the gate line and is silicided therewith.

6. A method in accordance with claim 5 in which the gate line is of conductive polycrystalline silicon.

7. A method in accordance with claim 6 in which a layer of silicon oxide is provided on the sides of the gate line before the layer of polycrystalline silicon is deposited on the surface of the silicon body on each side of the gate line.

8. A method in accordance with claim 7 in which the silicon oxide layer is provided on the sides of the gate line by heating the body in an atmosphere containing oxygen to form a layer of silicon oxide over the top and sides walls of the gate line and the surface of the silicon body on each side of the gate line, and then anisotropically etching the silicon oxide layer to remove the portions of the silicon oxide layer over the top of the gate line and on the surface of the silicon body on each side of the gate line.

9. A method of making a CMOS semiconductor device in a body of single crystalline silicon having a major surface comprising the steps of:
   forming in the body adjacent well regions of opposite conductivity type;
   forming an isolation region of an insulating material in the body extending from the major surface along the junction of the well regions;
   forming a separate thin layer of silicon oxide on a portion of the major surface of the silicon body over each of the well regions;
   forming a separate gate line of a conductive material over each of the silicon oxide layers;
   then forming a layer of polycrystalline silicon on the major surface of the silicon body on each side of each of the gate lines;
   then forming in the polycrystalline silicon layer a region of a refractory metal silicide which extends at least partially through the polycrystalline silicon layer;
   then doping the metal silicide region over each of the well regions with a conductivity modifier of a conductivity type opposite that of the well region; and
   then heating the device to diffuse the conductivity modifiers through the polycrystalline silicon layer into the silicon body to form shallow source and drain regions in each well region on each side of the gate line.

10. A method in accordance with claim 9 in which the polycrystalline silicon layer is deposited on the major surface of the silicon body by chemical vapor deposition, and the silicide region is formed by depositing a refractory metal on the polycrystalline silicon layer and heating the polycrystalline silicon layer to cause the metal to react with the silicon and form the metal silicide.

11. A method in accordance with claim 10 in which the metal silicide is doped by diffusing the conductivity modifier into the silicide region.

12. A method in accordance with claim 10 in which the polycrystalline silicon layer is also deposited on the gate lines and the refractory metal is also deposited on the portion of the polycrystalline silicon layer which is on the gate lines and is silicided thereto.

13. A method in accordance with claim 12 in which the gate lines are of conductive polycrystalline silicon.

14. A method in accordance with claim 13 in which a layer of silicon oxide is provided on the sides of the gate lines before the layer of polycrystalline silicon is deposited on the surface of the silicon body on each side of the gate line and on the gate lines.

15. A method in accordance with claim 14 in which the polycrystalline silicon layer is selectively deposited on the surface of the silicon body on each side of the gate lines and on the surface of the gate lines, and the refractory metal is selectively deposited on the polycrystalline silicon layer.

* * * * *